United States Patent [19]

Wuidart et al.

[11] Patent Number: 5,469,100
[45] Date of Patent: Nov. 21, 1995

[54] CIRCUIT FOR THE GENERATION OF A TIME-STABILIZED OUTPUT PULSE

[75] Inventors: Sylvie Wuidart, Pourrieres; Tien-Dung Do, Aix-en-Provence, both of France

[73] Assignee: SGS Thomson Microelectronics, S.A., Gentilly, France

[21] Appl. No.: 260,705

[22] Filed: Jun. 16, 1994

[30] Foreign Application Priority Data

Jun. 23, 1993 [FR] France .................... 93 07601

[51] Int. Cl.[6] .......................... H03H 11/26; H03K 3/033
[52] U.S. Cl. .................. 327/262; 327/263; 327/264; 327/282; 327/291; 327/727
[58] Field of Search ............................ 327/172, 175, 327/261, 262, 263, 264, 284, 285, 290, 392, 398, 291, 227

[56] References Cited

U.S. PATENT DOCUMENTS

| | | | |
|---|---|---|---|
| 4,047,057 | 9/1977 | Ahmed | 327/227 |
| 4,305,010 | 12/1981 | Wise | 327/175 |
| 4,421,994 | 12/1983 | Puri et al. | 327/264 |
| 5,057,722 | 10/1991 | Kobatake | 307/605 |
| 5,081,380 | 1/1992 | Chen | 327/262 |

FOREIGN PATENT DOCUMENTS

| | | |
|---|---|---|
| 0015364 | 9/1980 | European Pat. Off. . |
| 0405319 | 1/1991 | European Pat. Off. . |
| 2310658 | 3/1976 | France . |
| 2620187 | 4/1976 | Germany . |

Primary Examiner—Timothy P. Callahan
Assistant Examiner—Jung Ho Kim
Attorney, Agent, or Firm—Robert Groover; Betty Formby

[57] ABSTRACT

A circuit for the generation of a time-stabilized output pulse Iout comprises a capacitor biased by two completely independent voltages whose bias voltages are fixed by a current generator through current mirrors and are therefore very stable.

4 Claims, 2 Drawing Sheets

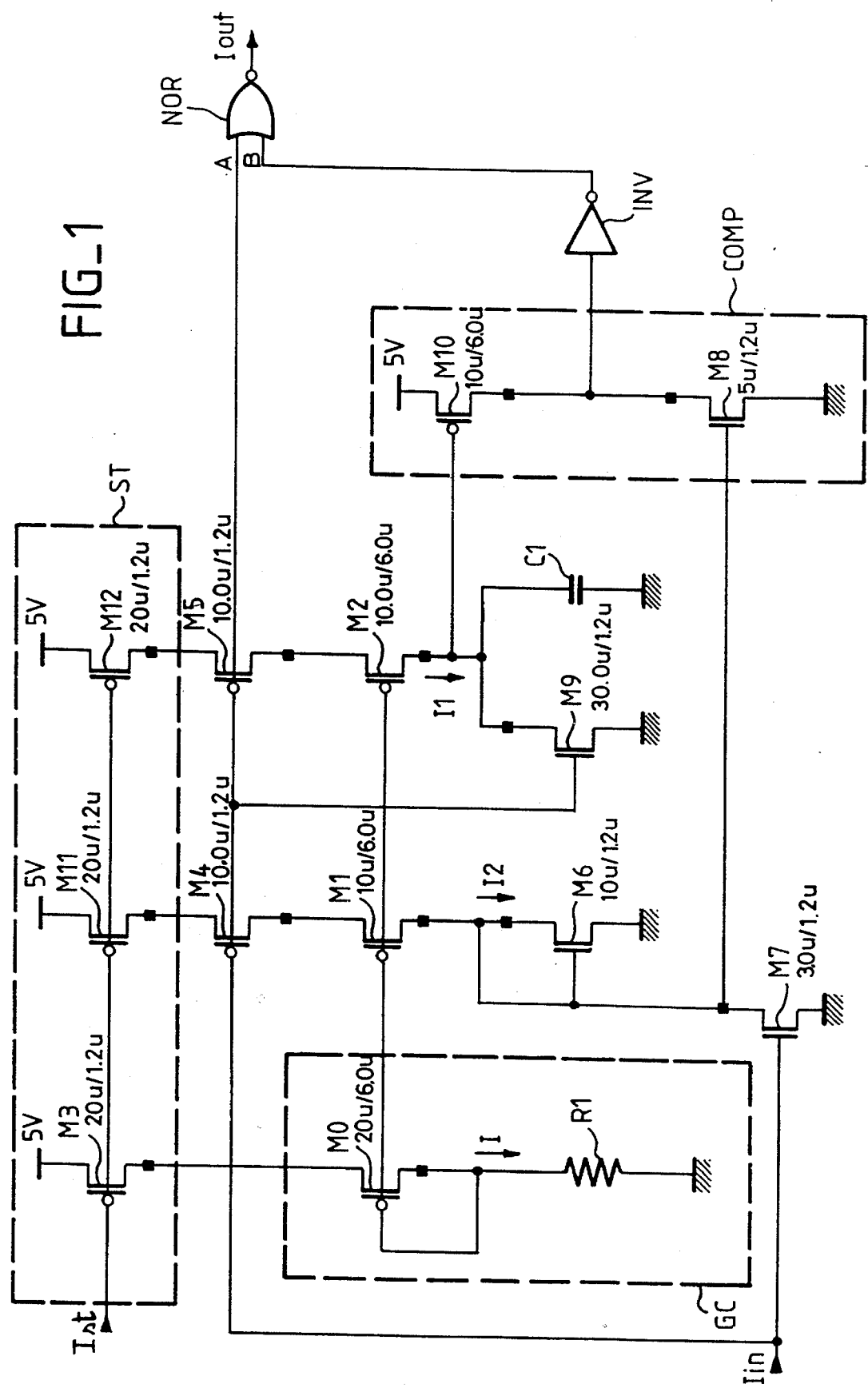

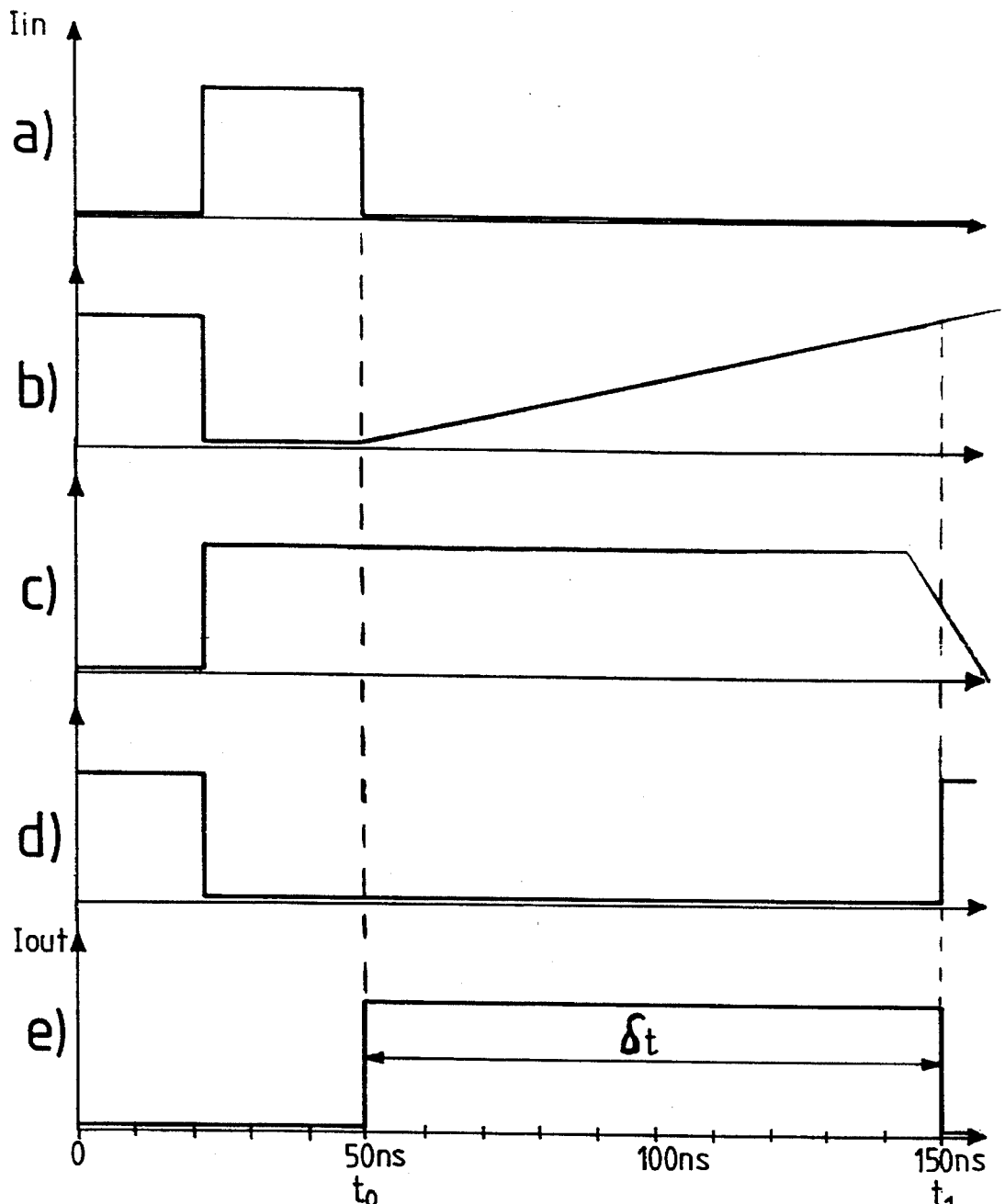
FIG_2

CIRCUIT FOR THE GENERATION OF A TIME-STABILIZED OUTPUT PULSE

BACKGROUND OF THE INVENTION

1. Field of the Invention

The present invention relates to the generation of a time-stabilized output pulse.

The invention can be applied more advantageously to the making of filters and, more generally, to the making of all circuits that require a reliable and stable time reference such as frequency detectors and generators of clock signals with a given duration.

2. Description of the Prior Art

A very standard method of generating a time-stabilized pulse uses circuits that bring into play the reproducibility of the characteristics of capacitor charging and discharging circuits to determine the parameters of the output pulse obtained after comparison with an input pulse that controls the operation of the charging and discharging circuits.

However, the known generation circuits of this type all comprise circuits such as output inverters that are very sensitive to temperature variations and to variations in manufacturing methods, to the point where the ratio between the longest output pulse and the shortest output pulse is very often of the order of 6 and, at best, about 4.5.

SUMMARY OF THE INVENTION

Thus, the technical problem to be resolved for the object of the present invention is that of proposing a generation circuit to generate a time-stabilized output pulse, of the type comprising a capacitor connected, firstly, to a charging circuit and, secondly, to a discharging circuit, said charging and discharging circuits being controlled by an output pulse, said generation circuit being one that would make it possible to obtain an output pulse duration that is far more stable for temperatures varying from −50° C. to 125° C. irrespectively of the methods of manufacture, this being the case for supply voltages of 3 to 7 volts.

According to the solution of the present invention to the technical problem raised, said generation circuit comprises a comparator constituted by:

- a first transistor biased by said capacitor, the capacitor being, firstly, discharged through the discharging circuit for a first level of the input pulse and, secondly, charged for a second level of the input pulse, through the charging circuit at a fixed current given by a first current mirror of a current generator,

- a second transistor in series with the first transistor, said second transistor being, firstly, turned off for the first level of the input pulse and, secondly, biased for the second level of the input pulse by a fixed bias voltage defined by a current given by a second current mirror of said current generator, said comparator delivering an output signal having, for the second level of the input pulse, a component with a variable level, corresponding to the charge of the capacitor, the variations of this component being defined by the value of the charging current of the capacitor and by the bias voltage of the second transistor so that, said output signal of the comparator being applied to logic means of comparison of the input pulse, the duration of the output pulse is determined by said value of the charging current of the capacitor and said bias voltage of the second transistor.

Thus, as shall be seen in detail further below, instead of making use, directly at output of the capacitor, of the standard output inverter with a wide variation in threshold voltage, the invention implements a comparator biased by two completely independent voltages whose bias voltages, which are fixed by the current generator through the current mirrors, are therefore very stable.

BRIEF DESCRIPTION OF THE DRAWINGS

Other advantages and features of the generation circuit according to the invention shall now be described with reference to the appended drawings, given by way of non-restrictive examples.

FIG. 1 is a diagram of a time-stabilized circuit according to the invention for the generation of an output pulse;

FIG. 2 shows timing diagrams representing the input pulse (a), the signal for the discharging and charging of the capacitor that biases the first transistor of the comparator of the circuit of FIG. 1(b), the output signal of the comparator (c), the output signal of the comparator after detection by an output inverter (d) and the output pulse (e).

MORE DETAILED DESCRIPTION

The diagram of FIG. 1 shows a circuit for the generation of a time-stabilized output pulse Iout. This circuit is of the type that comprises a capacitor C1 connected firstly to a charging circuit constituted by a transistor M2 working as a first current mirror of a current generator GC formed by a control transistor M0 mounted as a diode in series with a 60-KΩ resistor R1 for example and controlling the transistor M2. Furthermore, the capacitor C1 is connected to a discharging circuit constituted by a transistor M9 whose source is grounded. It will be seen in FIG. 1 that the drains of the transistors shown are marked with a black dot. Similarly, the value of the parameter W/L has been indicated for each transistor.

As can be seen in FIG. 1, said charging and discharging circuits are controlled by a pulse Iin applied to the input of the generation circuit. In relation with the timing diagrams (a) and (b), it can indeed be seen that when the input pulse Iin is at a first high level (+5 V), the P type transistor M5, which plays the role of a switch with respect to the standby circuit ST controlled by a signal Ist, is off, no current being capable of flowing in the first current mirror M2, while the N type transistor M9 of the discharging circuit is on, thus prompting the discharging of the capacitor C1 with a very small time constant. Conversely, when the input pulse Iin is at a second low level (0 V), the discharging transistor M9 is off while, since the switch M5 comes on, the capacitor C1 is charged at a current with a fixed value I1 given by the first current mirror M2. In the exemplary embodiment shown in FIG. 1, the current I1, which governs the charging speed of the capacitor C1, is half of the current I delivered by the current generator GC.

According to FIG. 1, the plus terminal of the capacitor C1 biases a first P type transistor M10 of a comparator COMP further comprising a second N type transistor M8 which, for the first high level of the input pulse Iin, is off because the N type transistor M7 is on while, for the second low level of the input pulse Iin, with the transistor M7 being off, the second transistor M8 of the comparator COMP is biased by the threshold voltage Vt of a bias transistor M6 mounted as a diode and supplied by a second current mirror formed by a transistor M1 controlled by the transistor M0 of the current generator. According to the embodiment shown in FIG. 1, the current given by the second current mirror has a value I2 equal to half of the current I delivered by the current generator GC.

Thus, for the first high level of the input pulse Iin, the capacitor C1 gets discharged swiftly so that the first transistor M10 whose bias potential falls to zero becomes conductive. Since, initially, the second transistor M8 is off, the output signal of the comparator COMP, shown at (c) in FIG. 2, is at a high level.

When the input pulse Iin is at its second low level, with the capacitor C1 getting charged, the first transistor M10 becomes less and less conductive as the bias voltage increases. At the same time, the second transistor M8 becomes slightly conductive owing to the fact that it is biased at the output voltage Vt. On the whole, the output signal of the comparator COMP is described according to substantially linear variations defined by the value I1 of the charging current of the capacitor C1 and by the bias voltage Vt of the second transistor M8.

The output of the comparator COMP is applied to an inverter INV which delivers, at its output, the logic signal illustrated at (d) in FIG. 2. The detection at t1 is a function of the two parameters I1 and Vt. The signal given by the inverter INV is applied to a first terminal of a NOR gate, the input pulse Iin being applied to a second terminal of the NOR gate so that the output signal of said gate is constituted by a pulse Iout, represented at (e) in FIG. 2, the duration at δt=tn–to of this pulse Iout being determined by the charging current I1 of the capacitor C1 and by the bias voltage Vt of the transistor M8 of the comparator COMP.

The generation circuit of FIG. 1 has a number of advantages that contribute to the stability, in terms of time, of the output pulse Iout. As has been emphasized already here above, the comparator COMP is biased by two completely independent levels which are furthermore determined by two fixed currents I1 and I2. Indeed, the current I given by the current generator GC is very stable in terms of manufacturing method for only the control transistor M0 is used. The current I is copied in the current mirrors by the transistors M2 and M1 that have the same W/L ratios.

It can also be seen that, in the first current mirror, only the transistor M2 is used to charge the capacitor C1. The transistor M9 is used only to discharge the capacitor C1 and therefore does not have any influence whatsoever on the width of the output pulse Iout. Only the variation in manufacturing method of the transistor M2 modifies the current I1 for charging the capacitor C1.

Furthermore, the generation circuit according to the invention is the site of compensation effects in terms of temperature and manufacturing method.

It is known that, when the temperature rises, the currents flowing in the transistors are lower. Consequently, since the current I1 given by the first current mirror is smaller, the capacitor C1 gets charged more slowly, the consequence of which is that the biasing of the first transistor M10 of the comparator is weaker, whence a lengthening of the output signal. By contrast, the transistor M8 of the comparator COMP is biased more strongly for the threshold voltage Vt of the bias transistor M6 is greater: the effect of this is to shorten the output signal. This results in an effect of compensation in temperature of the two transistors of the comparator. This compensation effect occurs also when the temperature falls.

When there is a variation in the manufacturing method, the threshold voltage of the transistors changes along with the currents flowing therein. These characteristics vary with the manufacturing method in a range or bracket delimited by a minimum profile and a maximum profile.

In the case of the minimum profile, the currents in the transistors are lower and the value of the bias voltages is higher.

When the voltage Vt increases, the bias transistor M6 applies a stronger bias to the second transistor M8 of the comparator COMP. However, this comparator COMP also has its own threshold which increases for the current is lower: this compensates for the increase in Vt.

When the threshold voltage rises, the current I1 flowing in the first current mirror is higher, and the capacitor C1 gets charged faster. By contrast, since the first transistor M10 of the comparator COMP has a lower current because of the threshold which increases, there is compensation as regards the manufacturing method.

Similarly, in the case of the maximum profile, there is a compensation of the transistor M7 by the transistor M8 and of the transistor M2 by the transistor M10.

The transistors M3, M11 and M12 are used in a standby circuit ST. In this mode, no generation of current can take place. The transistors M4 and M5 are used in pseudo-standby mode, i.e. the consumption in the two current mirrors is limited to a half-period of the input pulse Iin when this pulse is at a low level.

In normal operation, the consumption is constant in the current generator GC. Naturally, this consumption could have been limited to a half-period of the input pulse, as in the case of current mirrors. However, this approach averts the risks of disturbance and of malfunctioning of the circuit in dynamic mode of operation. This is why it is preferable to choose loss of consumption instead of a more stable current, and hence a more stable output pulse Iout.

In a practical application, we have:

| | | |
|---|---|---|
| I | = | 44 microamperes (stable) |
| I1 | = | 20 microamperes (stable) |
| I2 | = | 17 microamperes and 0 microampere when C1 is charged |
| C1 | = | 400 $10^{-15}$ farads |
| Vt | = | 0.83 volt for the N type transistors |
| | | 1.049 volts for the P type transistors |
| (typical manufacturing method, at 25° C. for Vcc = 25 volts) | | |

What is claimed is:

1. A generation circuit to generate a time-stabilized output pulse, of a type comprising a capacitor connected, firstly, to a charging circuit and, secondly, to a discharging circuit, said charging and discharging circuits being controlled by an input pulse, wherein said generation circuit comprises a comparator constituted by:

a first transistor biased by said capacitor, the capacitor being, firstly, discharged through the discharging circuit for a first level of the input pulse and, secondly, charged for a second level of the input pulse, through the charging circuit at a fixed current given by a first current mirror of a current generator, a second transistor in series with the first transistor, said second transistor being, firstly, turned off for the first level of the input pulse and, secondly, biased for the second level of the input pulse by a fixed bias voltage defined by a current given by a second current mirror of said current generator, said comparator delivering an output signal having, for the second level of the input pulse, a component with a variable level, corresponding to a charge of the capacitor, variations of this component being defined by a value of the charging current of the capacitor and by the bias voltage of the second transistor so that, said output signal of the comparator being applied to logic means of comparison of the input pulse, a duration of output pulse of the logic means is determined by said value of the charging current of the capacitor and said bias voltage of the second transistor.

2. A generation circuit according to claim 1, wherein said current generator comprises by a control transistor mounted as a diode.

3. A generation circuit according to claim 1, wherein said bias voltage of the second transistor of the comparator is a threshold voltage of a bias transistor supplied with the current given by the second current mirror.

4. A generation circuit according to claims 1, wherein the first and second current mirrors each comprise a transistor biased by said control transistor.

* * * * *